(12) United States Patent
Niuya et al.

(10) Patent No.: US 6,979,655 B2
(45) Date of Patent: Dec. 27, 2005

(54) SUBSTRATE PROCESSING METHOD AND SUBSTRATE PROCESSING APPARATUS

(75) Inventors: Takayuki Niuya, Tokyo-To (JP); Takehiko Orii, Nirasaki (JP); Hiroyuki Mori, Nirasaki (JP); Hiroshi Yano, Nirasaki (JP); Mitsunori Nakamori, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 200 days.

(21) Appl. No.: 10/295,041

(22) Filed: Nov. 15, 2002

(65) Prior Publication Data

US 2003/0119318 A1 Jun. 26, 2003

(30) Foreign Application Priority Data

Nov. 15, 2001 (JP) .............................. 2001-350035

(51) Int. Cl.[7] .......................................... H01I 21/302
(52) U.S. Cl. ...................... 438/745; 438/750; 438/751; 134/2
(58) Field of Search ................ 438/745, 750, 438/751, 749; 134/1.1, 1.2, 1.3, 2, 38, 49; 430/313, 329

(56) References Cited

U.S. PATENT DOCUMENTS 6,358,329 B1 * 3/2002 Muranaka et al. ............ 134/26
6,508,887 B1 * 1/2003 Park et al. ..................... 134/2
6,613,692 B1 9/2003 Toshima et al.

* cited by examiner

Primary Examiner—Lan Vinh
(74) Attorney, Agent, or Firm—Smith, Gambrell & Russell, LLP

(57) ABSTRACT

A resist film and a polymer layer adhered on a semiconductor substrate can be removed by the method according to the present invention. A first processing liquid, typically including a oxidizing agent, such as hydrogen peroxide solution, is fed to the substrate, thereby the condition of the resist film and the polymer layer is changed. Next, a second processing liquid, typically including a dimethyl sulfoxide and an amine solvent, is fed to the substrate, thereby the resist film and the polymer layer is dissolved and lifted off from the substrate. A sputtered copper particles included in the polymer layer can also be removed.

19 Claims, 10 Drawing Sheets

SUBSTRATE PROCESSING METHOD AND SUBSTRATE PROCESSING APPARATUS

BACKGROUND OF THE INVENTION

1. Field of the Invention

This invention relates to a substrate processing apparatus and substrate processing method for removing, utilizing a processing liquid, adhesives such as resist, polymers, etc., which adhere to the substrate during the process of the substrate, such as semiconductor device manufacturing process.

2. Description of the Related Art

Recently, in the process of manufacturing semiconductor devices, the miniaturization of design rules has rapidly progressed. Along with this has come the use of a low-dielectric-constant organic film as an interlayer insulating film called low-k film, and the use of Cu having low electrical resistance as a wiring-layer material instead of Al, in view of the high speed operation of the semiconductor devices.

Dual damascene process has been utilized to form Cu wiring layers with the interlayer insulating film being arranged between the adjacent Cu wiring layers. The dual damascene process, for example, is carried out in the following order. A stop layer is formed on the already-formed Cu wiring layer in the damascene structure of the under level, and on the stop layer a low-k interlayer insulating film is formed. On the interlayer insulating film, a resist film is formed according to a predetermined pattern. Via-etching is carried out by using the resist film as a mask. Then, after the resist film and the polymers in the hole are removed, a sacrifice layer is formed. Once again, a resist film with a specific pattern is formed on the interlayer insulating film, and trench etch is carried out by using the resist film as a mask. Then the resist and polymers in the hole are removed. Then, after the sacrifice layer and the stopper layer are removed by etching, a top Cu wiring or a plug is formed.

The removal of the aforementioned resist and polymers is conducted by performing wet cleaning after dry ashing. This is because, it is not possible, until now, to completely remove the resist and the polymer only through the application of wet cleaning, utilizing a processing liquid.

However, when dry ashing is conducted at the step of removing resist after the manner of pattern processing, damage is done to the low-k film that is the interlayer insulating film, causing a variety of problems with integration with the Cu wiring.

SUMMARY OF THE INVENTION

The objective of the present invention, developed in consideration of the aforementioned problems, is to provide a method and apparatus for removing a resist and a polymer layer without damaging the underlying layer.

To attain the above objective, the present invention provides a substrate processing method, which includes: a step of preparing a substrate on which objects to be removed are adhered, the objects including a resist film and a polymer layer; a step of supplying a first processing liquid onto a substrate in such a manner that the first processing liquid flows on a surface of the substrate, thereby altering the condition of the objects; and a step of supplying a second processing liquid onto a substrate in such a manner that the second processing liquid flows on a surface of the substrate, thereby dissolving the objects thus altered by the first processing liquid and lifting them off from the substrate.

The objects to be removed from the substrate may include a sputtered metal. In this case, the metal is oxidized by the first processing liquid in the step of supplying the first processing liquid, and the step of supplying the second processing liquid is carried out while avoiding oxidation of the substrate.

According to the second aspect of the present invention, a substrate processing apparatus is provided, which includes: a rotor adapted to hold the substrate; an enclosure defining a processing space configured to accommodate the rotor; means for supplying a first processing liquid to the substrate, the first processing liquid having an ability of altering a condition of objects to be removed that are adhered on the substrate, the objects including a resist film and a polymer layer; means for supplying a second processing liquid to the substrate, the second processing liquid having an ability of dissolving the objects and lifting off the objects.

The objects to be removed from the substrate may further include a sputtered metal. In this case, the first processing liquid further has an ability of oxidizing the metal, and the second processing liquid further has an ability of dissolving the sputtered metal oxidized by the first processing liquid.

Preferably, the apparatus further include an inert gas feeder that supplies an inert gas to establish a non-oxidizing atmosphere in the processing space.

The above and other objectives, features, and advantages of the present invention will be apparent from the following detailed description of the preferred embodiments of the invention in conjunction with the accompanying drawings.

DESCRIPTION OF THE PREFERRED EMBODIMENTS

Figure 1:
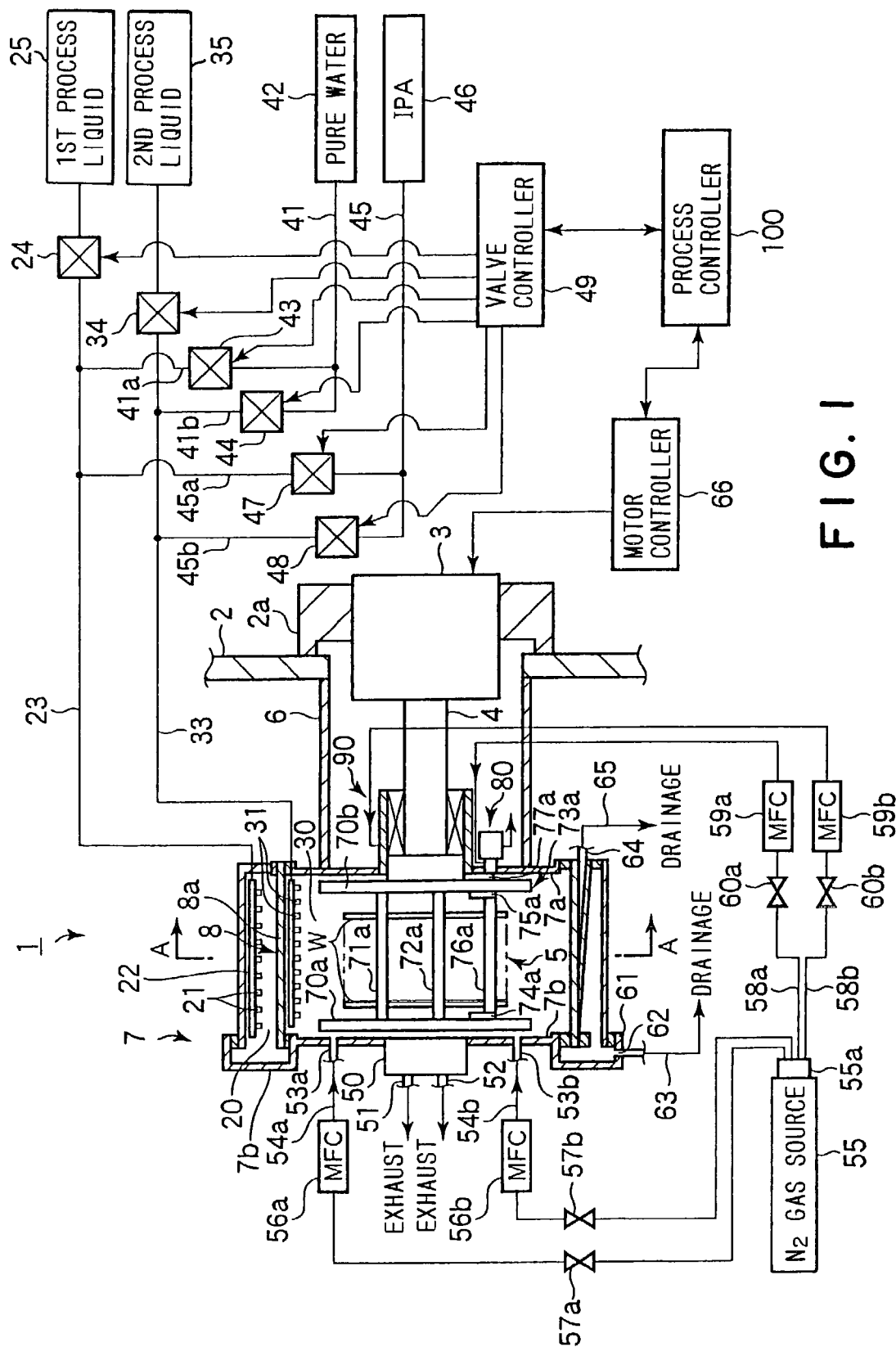
FIG. 1 is a cross-sectional view of the wafer processing apparatus, in which the inner cylinder is imposed on the outer pipe.
Figure 2:
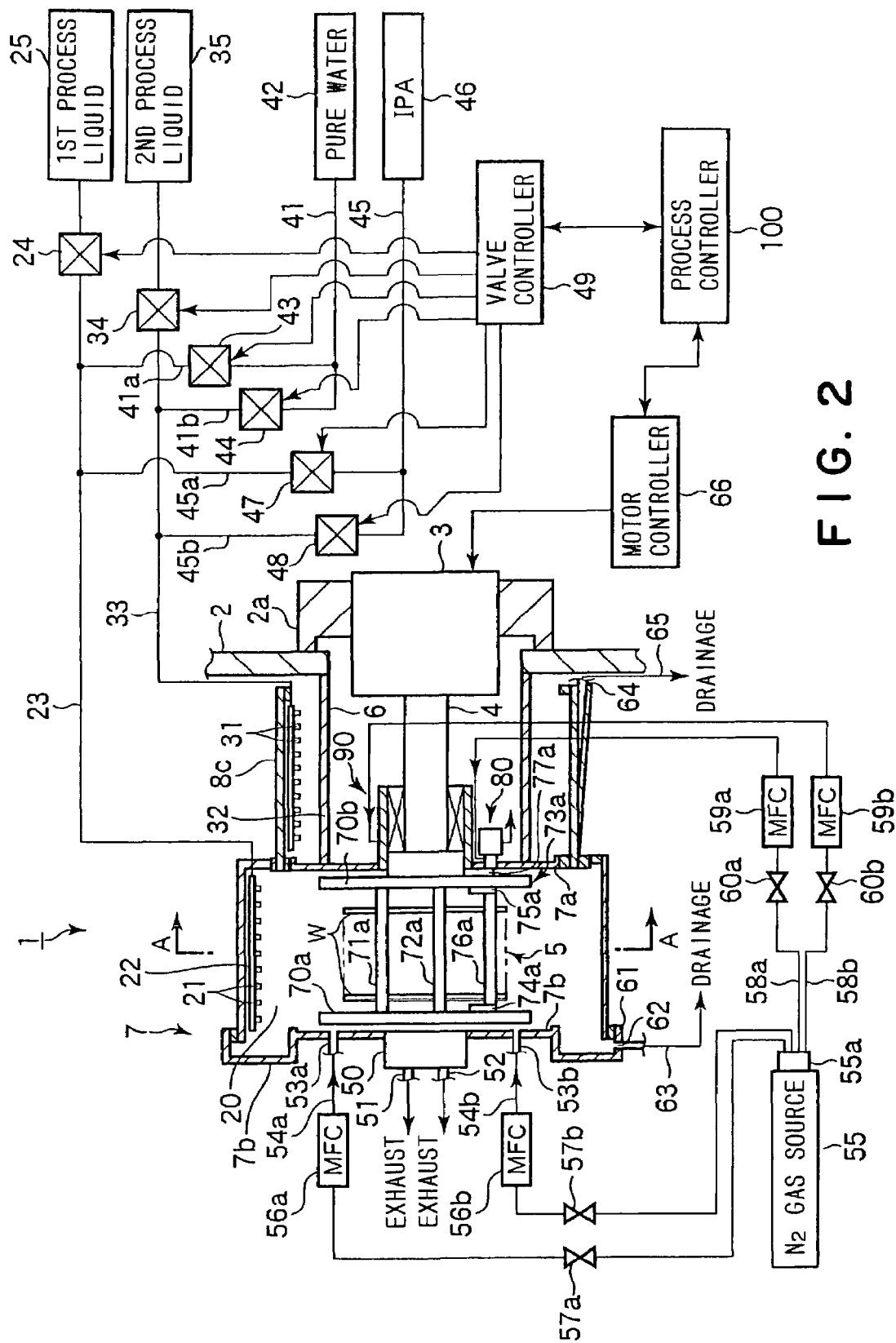
FIG. 2 is a cross-sectional view of the processing apparatus displaying the status in which the inner cylinder is in the position of being removed to the exterior of the outer cylinder.
Figure 3:
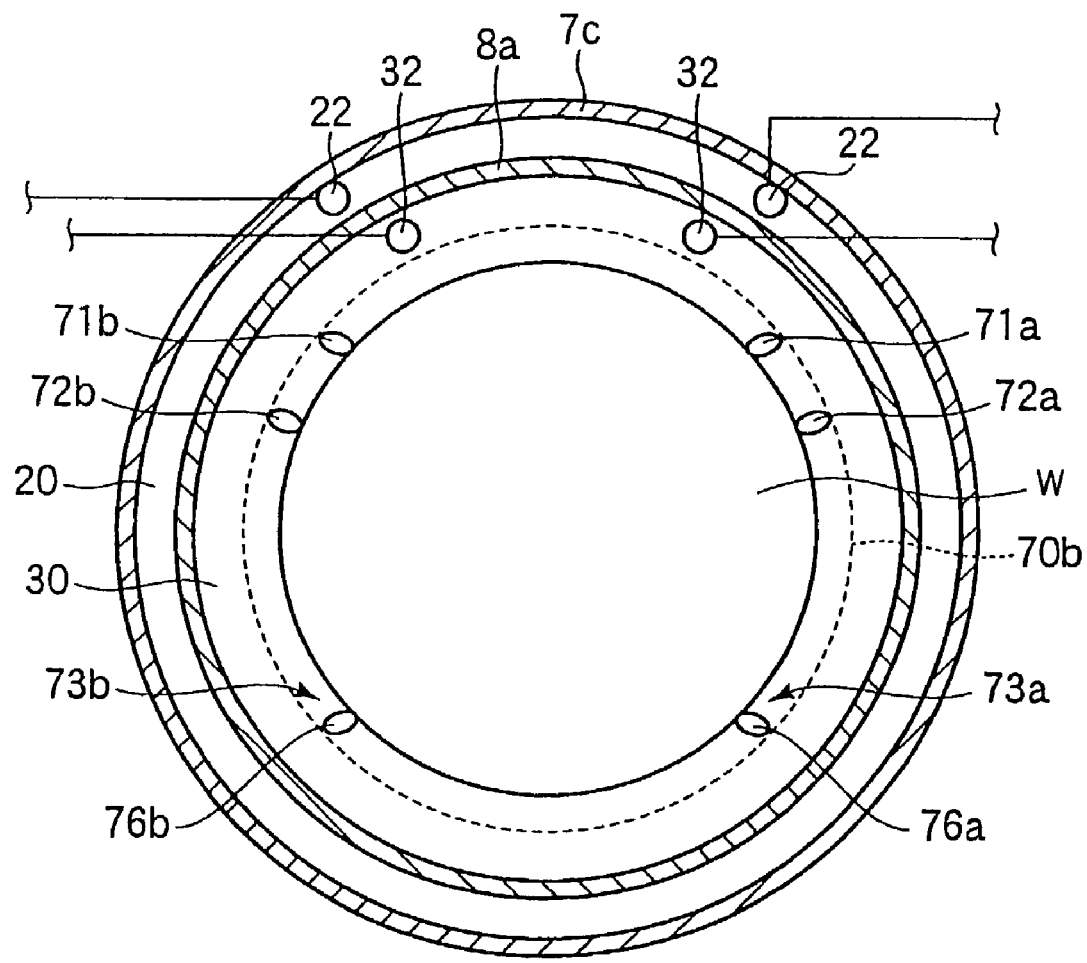
FIG. 3 is a cross-sectional view of the processing apparatus taken along the line A—A shown in FIG. 1.

The processing apparatus 1 according to the present invention is used for the removal of resist layers, polymer layers that are residual of the etching process, and metallic sputter, after the semiconductor wafer (hereinafter referred to as simply "wafer") W has been subjected to the etching process. As shown in FIGS. 1 thru 3, A motor 3 is affixed to a vertical support wall 2 of the processing apparatus 1 via a support member 2a in such a manner that the revolving shaft 4 of the motor 3 faces a horizontal direction. A rotor 5 is attached to the shaft 4 of the motor 3. A tubular casing 6 extends in a horizontal direction from the support wall 2, and surrounds the motor 3 and the shaft 4. The casing 6 support first enclosure forming members 7 and second enclosure forming members 8 adapted to enclose the rotor 5.

The rotor 5 is configured to hold a plurality of wafers W (for example 26 pieces) that are stood vertically and aligned in a horizontal direction. The motor 3 rotates the rotor 5, along with the held plurality of wafers W.

The first enclosure forming members 7 include a vertical wall 7a located near the motor 3, a vertical wall 7b located further from the motor 3 and an outer cylinder 7c that is provided around the rotor 5, ensuring a clearance between the rotor 5 and the outer cylinder 7c. In the central portion of the vertical wall 7b, the revolving shaft 4 which penetrates the vertical wall 7b, and a sealing mechanism 90 (explained in detail later) which seals the space between the vertical wall 7b and the revolving shaft 4, are provided. The outer cylinder 7c can retract on the casing 6 side when mounting the wafers W onto the rotor 5.

The second enclosure forming members 8 include an inner cylinder 8a, the diameter of which is smaller that that of the outer cylinder 7c. The inner cylinder 8a can transit between the liquid processing position depicted in FIG. 1 and the retracted position depicted in FIG. 2. When the inner cylinder 8a is in the liquid processing position within the outer cylinder 7c as shown in FIG. 1, a processing space 30 is defined by the inner cylinder 8a and the vertical walls 7a and 7b (in other words the second enclosure forming members 8). When the inner cylinder 8a is in the retracted position and the outer cylinder 7c is in the liquid processing position as shown in FIG. 2, a processing space 20 is defined by the first enclosure forming members 7. The processing space 20 and the processing space 30 are made airtight by a sealing mechanism, not shown.

Two spray nozzles 22 (see FIG. 3), which have a number of spray outlets 21, are attached horizontally to the upper end portion of the outer cylinder 7c defining the processing space 20. Connected to the spray nozzle 22 is a pipe 23, to which a first processing liquid supply mechanism 25, which supplies a first processing liquid, is connected via a valve 24. The first processing liquid, which flows through the pipe 23 from the first processing liquid supply mechanism 25, is sprayed from the spray outlets (nozzle openings) 21 of the spray nozzle 22. The first processing liquid has an ability of altering the condition of the resist film and the polymer layers, and further serves to oxidize sputtered metals such as Cu particles. The first processing liquid is primarily made up of an inorganic chemical liquid that contains an oxidizing agent such as hydrogen peroxide solution. The first processing liquid functions to alter the surface layers of the resist film and the polymer layers from a hydrophobic state to a hydrophilic state.

Two spray nozzles 32 (refer to FIG. 3), which have a number of spray outlets 31, are attached horizontally to the upper end portion of the inner cylinder 8a that defines the processing space 30. Connected to the spray nozzle 22 is a pipe 33, to which a second processing liquid supply mechanism 35, which supplies a second processing liquid, is connected via a valve 34. The second processing liquid, which flows through the pipe 33 from the second processing liquid supply mechanism 35 is sprayed from the spray outlets 31 of the spray nozzle 32. The second processing liquid comprises an organic chemical liquid that serves to dissolve and lift off the resist film, the polymer layers, and the metals that were oxidized by the first processing liquid. The second processing liquid contains, for example, dimethyl sulfoxide (DMSO) and amine solvent.

Pure water and isopropyl alcohol (IPA) can be sprayed from the spray nozzles 22 and 32, via the pipes 23 and 33, respectively. A pipe 41 extends from a pure water supply mechanism 42, and from the pipe 41 diverge pipes 41a and 41b, which are connected to the pipes 23 and 33, respectively. A pipe 45 extends from an isopropyl alcohol (IPA) supply mechanism 46, and from the pipe 45 diverge pipes 45a and 45b, which are connected to pipes 23 and 33, respectively. Thus, pure water flows from the pure water supply mechanism 42 through the pipe 41 to the pipe 41a and the pipe 41b, and is supplied by both the pipes 23 and 33, respectively. IPA flows from the IPA supply mechanism 46 through the pipe 45 to the pipe 45a and the pipe 45b, and is supplied by both the pipe 23 and the pipe 33, respectively. Valves 43, 44, 47 and 48 are provided on the pipes 41a, 41b, 45a and 45b, respectively. In addition, a valve controller 49 controls the opening and closing of valves 24, 34, 43, 44, 47 and 48. The valve controller 49 is controlled by a process controller 100, which controls the entire processing of the wafers W.

Protruding from an exterior side of a central portion of the vertical wall 7b is a protruding part 50, to which two exhaust ports 51 and 52 are connected. These exhaust ports 51 and 52 are used to exhaust the processing space 20 and the processing space 30, respectively. Closing mechanisms for both ports 51 and 52 are provided inside the protruding part 50.

At the vertical wall 7b, on the exterior side of protruding part 50, two $N_2$ gas introduction ports 53a and 53b are provided to introduce $N_2$ gas (inert gas) to at least the processing space 30 that is formed inside the inner cylinder 8a. Gas supply pipes 54a and 54b are connected to the $N_2$ gas introduction ports 53a and 53b, respectively. $N_2$ gas is supplied from an $N_2$ gas supply source 55 to the processing space 30 through the gas supply pipes 54a and 54b and the $N_2$ gas introduction ports 53a and 53b, respectively. Of course, with the inner cylinder 8a in the retracted position, the $N_2$ gas may also be provided via the $N_2$ gas introduction ports 53a and 53b to the processing space 20 that is formed inside the outer cylinder 7c. A heater 55a for heating the $N_2$ gas is attached to the $N_2$ gas supply source 55.

By elevating the temperature inside the processing space 30 by supplying heated $N_2$ gas thereto, it is possible to enhance the dissolving action of the processing liquid. To each of the gas supply pipes 54a and 54b, mass-flow controllers 56a and 56b and valves 57a and 57b are provided. Gas supply pipes 58a and 58a are connected to the $N_2$ gas supply source 55. The gas supply pipe 58a is connected to a switching mechanism 90, to be explained later, that is provided at a central area of the vertical wall 7a. The gas supply pipe 58a is connected to a sealing mechanism 90, to be explained later, that is provided at a central area of the vertical wall 7a. To each of the gas supply pipes 58a and 58a, mass-flow controller 59a and 59b and valves 60a and 60b are provided. The inert gas is not limited to $N_2$ gas, but may be Ar gas or any other kind of inert gas.

A ring 61 is provided around the exterior of the vertical wall 7b. Provided at the bottom of the ring 61 is a first drain port 62, which discharges processing liquid, pure water or IPA used in the processing space 20 defined by the outer cylinder 7c in the processing position depicted in FIG. 2. Drainpipe 63 is connected to the first drain port 62. The bottom of the inner cylinder 8a is inclined toward the motor 3. Provided at the bottom of the inner cylinder 8a is a second drain port 64, which is located at the vertical wall 7a side end of the inner cylinder 8a when it is positioned at the processing position as shown in FIG. 1. The second drain port 64 discharges used processing liquid, pure water or IPA from the processing space 30. A drainpipe 65 is connected to the second drain port 64. It is possible to recycle liquids discharged through these drainpipes 63 and 65.

The rotor 5 is equipped with: a pair of discs 70a and 70b, positioned with a space therebetween; a pair of first fixed bars 71a and 71b and a pair of second fixed bars 72a and 72b, the ends of which are securely fixed to the discs 70a and 70b; and a pair of support mechanisms 73a and 73b, which support, from the bottom, the wafers W engaged by fixed bars 71a, 71b, 72a, and 72b. Each of the fixed bars 71a, 71b, 72a, and 72b have a plurality of grooves (not shown), into which the edges of wafers Ware inserted. Pressure sensors are attached to one of the fixed bars 71a, 71b, 72a, and 72b.

Support mechanism 73a has an arm 74a positioned at the inside of disc 70a, an arm 75a positioned at the inside of disc 70b, and a mobile support bar 76a, which is linked to arm 74a and arm 75a and supports the wafers W. Balance weights 77a (disc 70b side shown only) are provided to arms 74a and 75a, respectively, in such a manner that each disk is located between the balance weight and the corresponding arm. Support mechanism 73b is constructed in the same fashion, having a mobile support bar 76b that supports the wafers W.

Figure 4:
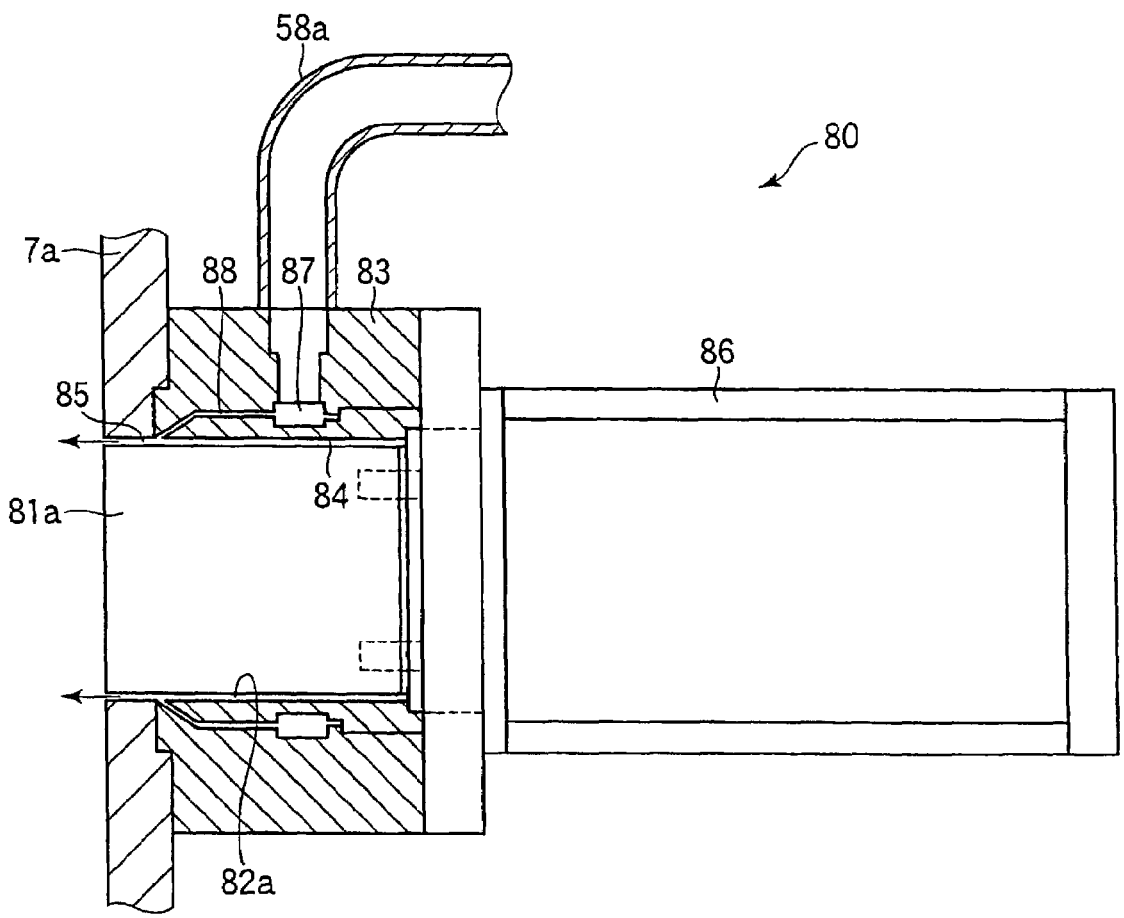
FIG. 4 is an enlarged cross-sectional view of the switching mechanism of the processing apparatus of FIG. 1, and parts disposed adjacent to the switching mechanism.

Switching mechanisms 80 are provided on the support mechanism 73a side and the support mechanism 73b side, respectively. The latter has a switching part 81a as shown in FIG. 4. By rotating the switching part 81a, the balance weight 77a can be turned, which causes the arm 75a to turn the support bar 76a. The former, namely the switching mechanism on the support mechanism 73b side, is constructed in the same fashion, and the support bar 76b is turned the same way. Accordingly, switching between having the wafers W in a supported state and the support being released in a released state can be done via the two switching mechanisms 80.

As can be seen in FIG. 4, the switching part 81a is received by an opening 82a, which is provided in the vertical wall 7a. Arranged on the motor 3 side of the opening 82a is a boss 83, in which a through hole following the opening 82a is formed. The switching part 81a is inserted into the through hole of the boss 83 so as to have only a slight clearance 84. A space 85 exists between the tip of the switching part 81a and the opening 82a. A revolving cylinder 86 is provided on the motor 3 side of the boss 83. The switching part 8 la is linked to the revolving cylinder 86, and can be rotated by the movement of the revolving cylinder 86. A ring-shaped passage 87 is formed in the boss 83, and the previously described gas supply pipe 58a is connected to a part of this passage 87. Provided in the boss 83 is a narrow ring-shaped passage 88, which is connected to the passage 87 and extends toward the processing space 20 and the processing space 30. This passage 88 is connected to the space 85 between the switching part 81a and the vertical wall 7a. By feeding $N_2$ gas through the gas supply pipe 58a, the $N_2$ gas passes through the passage 88 from the passage 87 and flows into either processing space 20 or 30 from the space 85. In this manner, supply of $N_2$ gas allows for supplementary adjustments to be made to the atmosphere of the processing space 30, or if needed, processing space 20.

It is also possible to prevent the processing liquid from remaining in the space 85 between the switching part 81a and the vertical wall 7a. If the liquid remains and dries to from particles, it could cause the wafer to become polluted, but by preventing the liquid from remaining in the space 85, this type of problem disappears.

Figure 5:
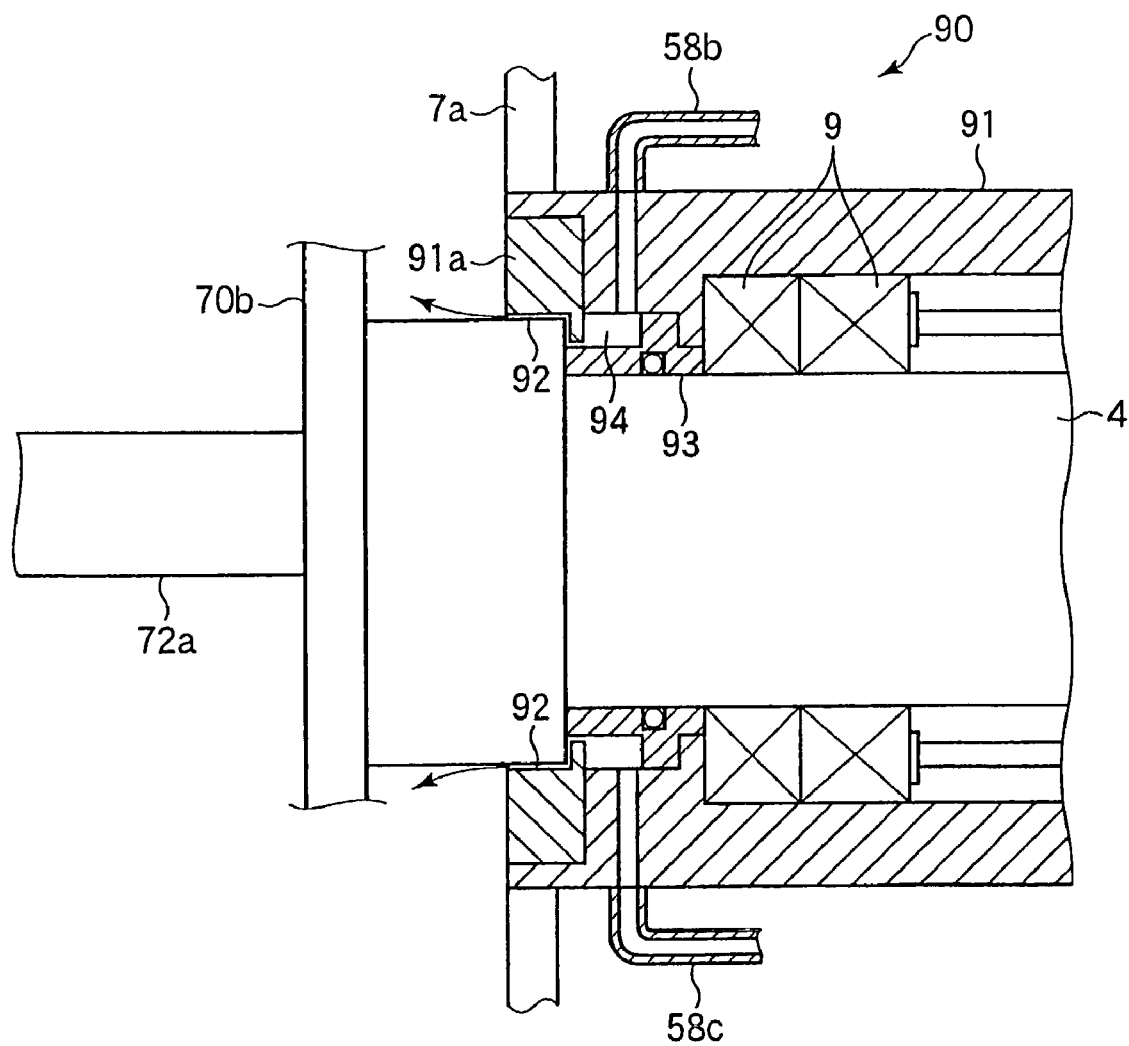
FIG. 5 is an enlarged cross-sectional view of the seal mechanism of the processing apparatus of FIG. 1, and parts disposed adjacent to the switching mechanism.

Next, the seal mechanism 90 provided at the central area of vertical wall 7a will be explained. FIG. 5 is an enlarged cross-sectional view showing the detailed arrangement of the seal mechanism 90 and surrounding area, which is simplified in FIG. 1.

As shown in FIG. 5, provided at the central area of vertical wall 7a is a hollow, cylindrical body 91, which encloses the revolving shaft 4. Between the tip of the cylindrical body 91a and the revolving shaft 4, a slight clearance 92 is provided. Between the cylindrical body 91 and the revolving shaft 4, a bearing 93 that allows the shaft 4 to rotate thereon, and a liquid sealing member 9 that seals a space between the cylindrical body 91 and the shaft 4, are provided. A ring-shaped passage 94 is arranged between the cylindrical body 91 and the bearing 93. Connected to the passage 94 are the gas supply pipe 58a for supplying $N_2$ gas into the passage 94 and a gas exhaust pipe 58c for discharging the gas from the passage 94.

The passage 94 is connected to the processing spaces 20 and 30 via the clearance 92. With such a construction, by feeding $N_2$ gas through gas supply pipe 58a, the $N_2$ gas passes through the clearance 92 from the passage 94 and flows into either processing space 20 or 30. By doing so, supply of the $N_2$ gas not only allows for supplementary adjustments to be made to the atmosphere of the processing space 30, or if needed, processing space 20, but also serves to prevent the processing liquid from remaining in the clearance 92 surrounding the revolving shaft 4.

The motor 3, which rotates the rotor 5, is controlled by motor controller 66, and can adjust the rotation speed of the rotor 5 to a desired rotation speed. Also, during processing, the rotation speed of rotor 5 can be changed at will, for example, the rotation speed of rotor 5, in other words that of the wafers W, can be sped up or slowed down repeatedly. The motor controller 66 is controlled by the process controller 100, described above.

Figure 6:
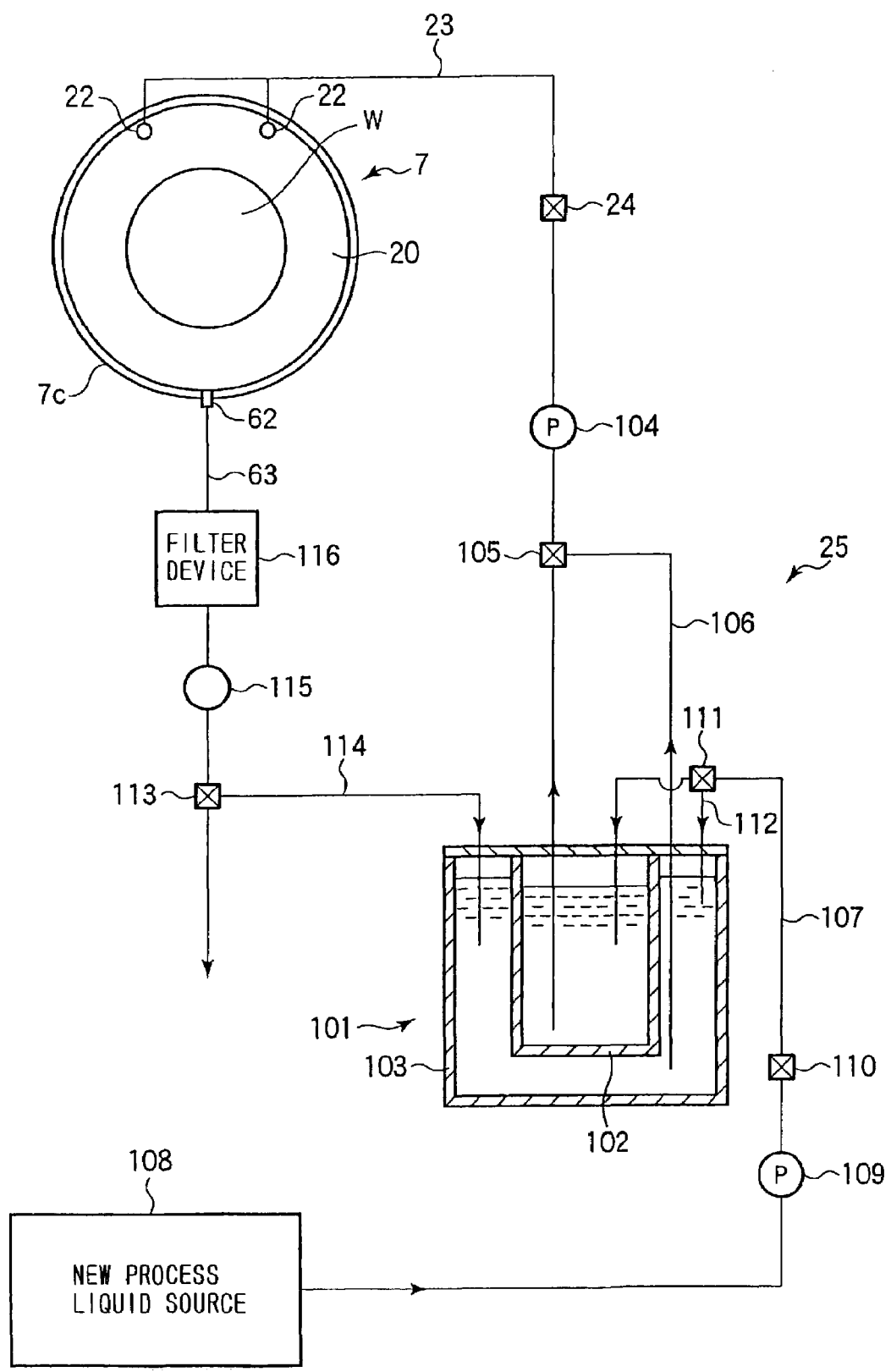
FIG. 6 is an illustration schematically showing the structure of the first processing liquid supply mechanism of the processing apparatus.

Next, first processing liquid supply mechanism 25 will be explained. FIG. 6 is a diagram schematically showing the structure of the first processing liquid supply mechanism 25. The first processing liquid supply mechanism 25 has a processing liquid tank 101, which holds the first processing liquid. The processing liquid tank 101 is a dual formation of a new liquid tank 102 on the inside, which holds new processing liquid, and a recycle tank 103 on the outside, which holds used processing liquid. The end portion of the pipe 23 is inserted into the new liquid tank 102 of the processing liquid tank 101. From a processing liquid supply pump 104 that is provided on the pipe 23, new liquid in the new liquid tank 102 is supplied to processing space 20 in the outer cylinder 7c via the pipe 23 and the spray nozzle 22. Provided at the downstream side of the processing liquid supply pump 104 is a switch valve 105, which is connected to a pipe 106. The pipe 106 is inserted into the recycle tank 103 of the processing liquid tank 101. Upon switching the switch valve 105 from the pipe 23 side to the pipe 106 side, used liquid in the recycle tank 103 is supplied to the processing space 20 in the outer cylinder 8a a via the pipe 106, the pipe 23 and the spray nozzle 22.

Inserted into the new liquid tank 102 of the processing liquid tank 101 is a new liquid supply pipe 107, to which a new liquid supply source 108 is connected. A new liquid supply pump 109 is provided on the new liquid supply pipe 107. A sensor (not shown) detects the level of the processing liquid in the new liquid tank 102. Based on detection by the sensor, new liquid can be supplied to the new liquid tank 102 from the new liquid supply source 108 via the new liquid supply pump 109, so as to keep the liquid level within a desired range.

Arranged on the pipe 107 are an open/close valve 110 and a switch valve 111, the latter 111 being located the downstream side of the former 110. Connected to the switch valve 111 is a pipe 112, which is inserted into the recycle tank 103. By switching this switch valve 111, it is possible to supply new processing liquid to the recycle tank 103 as well. A connecting passage (not shown) runs from the upper parts of the new liquid tank 102 to the recycle tank 103, so that any overflow of the processing liquid supplied to new liquid tank 102 flows into recycle tank 103.

The drainpipe 63, which is connected to the aforementioned first drain port 62, is connected to a switch valve 113. The switch valve 113 is connected to a pipe 114, which is inserted into the recycle tank 103 of the processing liquid tank 101. Upon switching the switch valve 113, it is possible for used first processing liquid that flows though the drainpipe 63 to be collected or recovered in the recycle tank 103 via the pipe 114. In the case that the liquid is not to be collected, by switching switch valve 133 to the drainpipe 63 side, the liquid can be discharged. In addition, used pure water, IPA etc., or uncollected first processing liquid that flows through drainpipe 63 can be disposed of separately due to the provision of a series of switch valves (not shown) at the downstream side of the switch valve 113.

Provided at the upstream side of the switch valve 113 on the drainpipe 63 are a concentration sensor 115 and a filter device 116, the latter 116 being located the upstream side of the former 115. The ability of the first processing liquid to process the wafer W is dependent on the concentration of the active components in the processing liquid. Thus, when the first processing liquid is collected, said concentration of the used first processing liquid is measured by the concentration sensor 115 as it flows through drainpipe 63. If said concentration is lower than an allowable level, adjustment of said concentration is carried out by the provision of new first processing liquid to the recycle tank 103 through pipe 112.

In the event that the concentration of the active components of the used first processing liquid becomes even lower to the point that it cannot be used, it is disposed of without being collected, by switching the switch valve 113. For a time after the initiation of processing in the processing space 20 in the outer cylinder 7c, waste liquid with a high degree of pollutant is discharged, and so is not collected and disposed of regardless of said concentration level. Instead of providing the concentration sensor 115, the timing for adjusting said concentration or disposing the used first processing liquid without collection may also be determined by calculation of the relationship between the number of times recycled and the concentration level. All of these controls are carried out by the process controller 100. The controller 100 also functions to control the amount of the new first processing liquid provided and the amount of the used first processing liquid recycled, so as to maintain the processing effectiveness of the first processing liquid in the recycle tank 103. In such an instance, when the processing effectiveness of the liquid in the recycle tank 103 falls below a determined level, the controller 100 sets the collection amount to zero, in other words does not attempt the recovery of the used first processing liquid.

Figure 7:
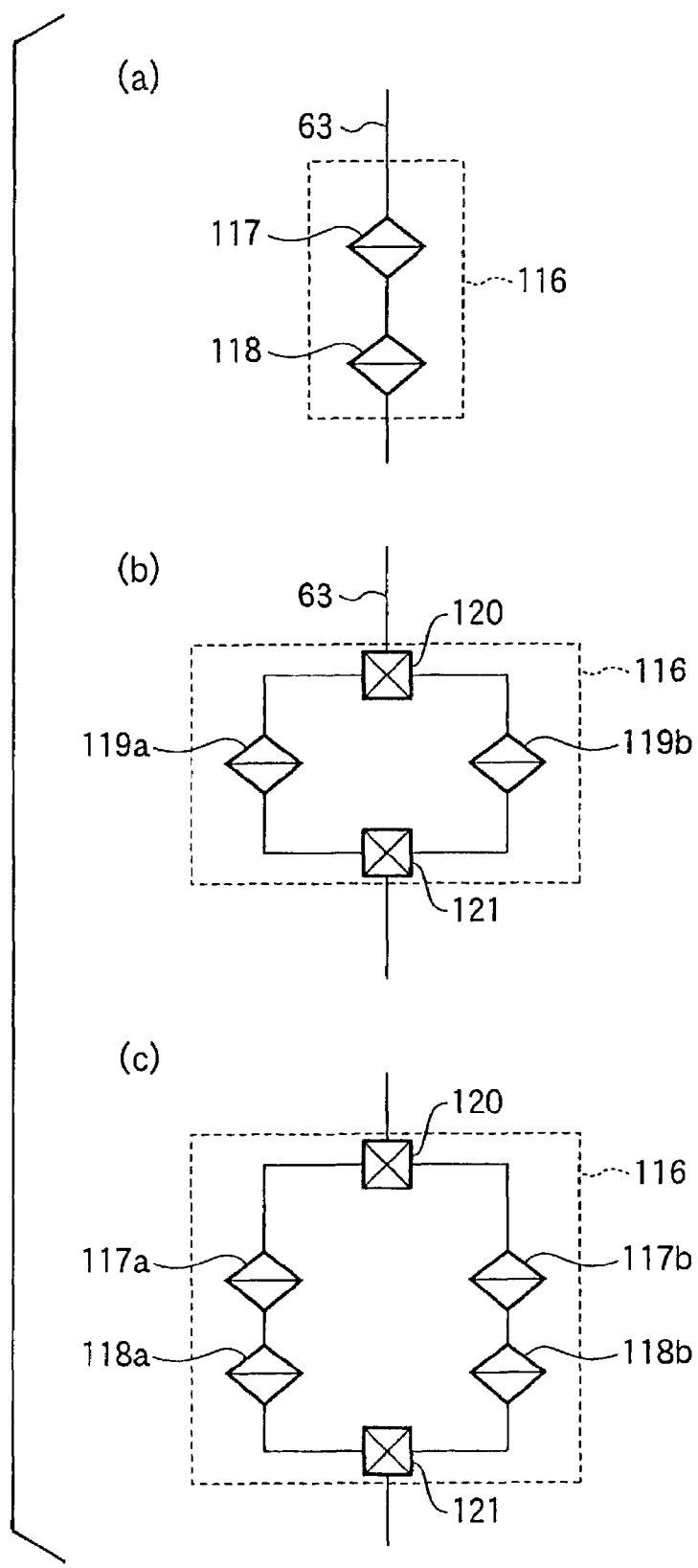
FIGS. 7(a) to 7(c) are illustrations of filter devices that are attached to the recycle pipe of the first processing liquid supply mechanism of the processing apparatus shown in FIG. 6.

The filter device 116 functions mainly to remove particles or other solids that mix with the discharge liquid as a result of the process to remove the resist film or the polymer layers. The filter device 116 may be comprised of a simple filter element. However, since the lifting-off of the resist film or the polymer layers may generate relatively large solids (particles), it is preferable to position a coarse filter element 117 on the upstream side and a fine filter element 118 on the downstream side, as shown in FIG. 7(a). Also, as shown in FIG. 7(b), it is also preferable to place identically-designed filter elements 119a and 119b in parallel. This makes it possible to conduct maintenance on one filter element, such as replacement, etc., while the other filter element is in use. Reference numerals 120 and 121 designate switch valves. As indicated in FIG. 7(c), it is also preferable to arrange a combination of the course filter element 117a and the fine filter element 118a and a similarly constructed combination of the course filter element 117b and the fine filter element 118a, in parallel. In this case, it is possible to achieve the same benefits as the constructions shown in the aforementioned FIGS. 7(a) and 7(b).

A second processing liquid supply mechanism 35, which supplies a second processing liquid, is constructed exactly the same as the above-described first processing liquid supply mechanism 25, and is similarly controlled by process controller 100. Accordingly, a repetitive explanation has been omitted.

Figure 8:
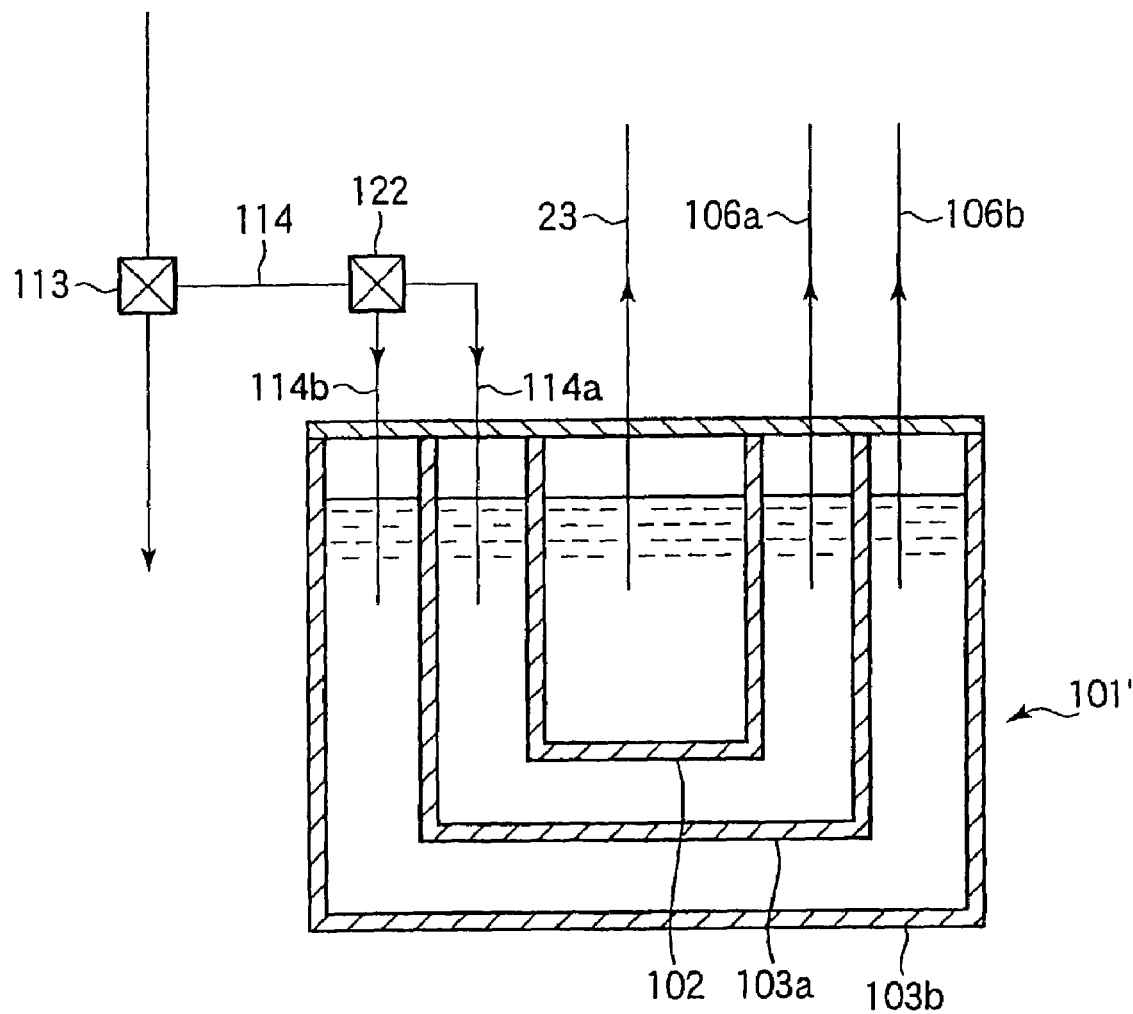
FIG. 8 is a cross-sectional view of another embodiment of a processing liquid tank of the first processing liquid supply mechanism of the processing apparatus of FIG. 1.

The processing liquid tank may be configured so that it has dual recycle tanks. FIG. 8 shows such a processing liquid tank 101'. This process tank 101' has a new liquid tank 102 on the innermost side, outside of this a first recycle tank 103a, and further to the outside is provided a second recycle tank 103b. In such a case, the pipe 114, which extends from switch valve 113 on the recycle pipe 63, joins with a pipe 114a inserted into the first recycle tank 103a, and a pipe 114b that is inserted into the second recycle tank 103b. Used processing liquid can be supplied to either the first or the second recycle tanks 103a and 103b by switching switch valve 122. In order to allow the processing liquid in the first or the second recycle tanks 103a and 103b to be supplied to the processing space 20 in the outer cylinder 7c, pipes 106a and 106b are inserted into the tanks 103a and 103b, respectively. With this type of construction like liquid tank 101', the processing liquid may be recycled from the first recycle tank 103a for the first half of the processing period, and for the latter half recycled from the second recycle tank 103b. Thereby, pollution of the liquid of the second recycle tank 103b is reduced, and the total amount of new liquid used can be reduced as well.

Next, the processing of substrates by using the above-described processing apparatus 1 will be described. As a first example, the liquid processing to be carried out after a via hole, which reaches to an underside Cu wiring layer, is formed in a low-k film made from an organic material with a low dielectric constant by using a patterned resist film, i.e., a resist mask.

Before explaining the liquid processing, the process steps of via-etching will be described with reference to FIG. 9. Firstly, as shown in FIG. 9(a), on the Cu wiring layer 171 inside the damascene structure 170, a stopper layer 172 and a low-k film 173 serving as an insulating layer are formed. Next, on top of the low-k film 173, a resist film 174 is formed. A wiring pattern is transferred onto the resist film 174 utilizing photo lithography technology.

Next, as shown in FIG. 9(b), using a plasma of etching gas, a via-hole 175 is formed by utilizing the resist film 174 as a mask. At this time, due to the components of the etching gas, a polymer layer 176 is formed on the inner walls of the via-hole 175. Then, at the time of etching, the polymer layer 176 functions as a protective layer and thus etching with a high degree of anisotropy can be achieved.

As etching progresses and reaches the Cu wiring layer 171 as shown in FIG. 9(c), Cu is sputtered, resulting in Cu particles 177 adhereing to the outer side of polymer layer 176. After the etching has reached the Cu wiring layer 171 over-etching is conducted, and a polymer layer 176 is again formed on the outside of Cu particle 177, as shown in FIG. 9(d). In other words, the Cu particles 177 are trapped inside the polymer layers 176.

In the state depicted in FIG. 9(d), the wafer W will be processed by the processing apparatus 1. As will be explained hereafter, due to this processing, the resist film 174, the polymer layers 176 and the Cu particles 177 will all be removed.

During this processing, firstly, with outer cylinder 7c and inner cylinder 8a retracted above the casing 6, by a conveying means not shown, a plurality of wafers W are placed on the rotor 5 from below, and are supported by the support arms 73a and 73b. At this time, the previously mentioned pressure sensor measures the pressure exerted on the wafers W as they are places on rotor 5, thereby avoiding damage to wafers W. Then, outer cylinder 7c is arranged outside the rotor 5, forming the airtight processing space 20, as shown in FIG. 2.

Next, as the wafers W are rotated due to the rotation of the rotor 5 by the motor 3, a first processing liquid, for example, made up of an inorganic chemical whose primary component is an oxidizing agent such as hydrogen peroxide solution, etc, is sprayed from the nozzle 22. As a result, the first processing liquid is supplied to the wafers W. Subsequently, the condition of the resist film 174 and the polymer layers 176 is altered, forming cracks which makes it easy for the processing liquid to penetrate, also oxidizing the sputtered Cu particles 177. In addition, the surface layers of the resist film 174 and the polymer layers are altered from a hydrophobic state to a hydrophilic state. At this time, since the sputtered Cu particles 177 react highly due to the influence of impurities contained there in, only the sputtered Cu particles are selectively oxidized, while the underlying Cu wiring layer 171 is not oxidized.

During the processing with the first processing liquid, while spraying the first processing liquid, by rotating the rotor 5 at a low speed in the range of 1 to 500 rpm for the first several tens of seconds. Thereby, the first processing liquid is spread over the surfaces of the wafers W. In this case, the speed of revolution of the rotor 5 can be used to control how evenly the first processing liquid is spread, based on its viscosity. After the first processing liquid spreads, the revolution speed of the rotor 5 is increased to a high speed in the range of 100 to 3000 rpm, thereby heightening the reactivity. From the standpoint of heightened reactivity, it is preferable to repeatedly alternate between low-speed and high-speed revolutions.

The atmosphere in the first process space 20 may be an air atmosphere. However, in order to completely avoid the oxidization of the Cu wiring layer 171, it is preferable that $N_2$ gas be fed to the first process space 20 from the supply source 55 to establish an inert gas atmosphere in the first process space 20.

The first processing liquid used in the processing is discharged though the first drain port 62 to the drainpipe 63, and collected in the recycle tank 103 of the processing liquid tank 101. As needed, in the time between the completion of processing with the first processing liquid and the start of processing with the second processing liquid, a new first processing liquid is supplied to the new liquid tank 102 from the new liquid source 108. Then, any overflow from the new liquid tank 102 is supplied to the recycle tank 103.

Next, inner cylinder 8a that was retracted above the casing 6 is moved to the inside of the outer cylinder 7c, as shown in FIG. 1, thereby forming the second process space 30 inside the inner cylinder 8a, and preparation for processing with a second processing liquid is thus carried out.

In this state, as needed, it is possible to conduct a rinse process by applying pure water or IPA to the wafers W as a rinse liquid while the wafers w are rotated on the rotor 5. Also, after the pure water or the IPA has been applied to the wafers W, a drying process may be conducted by spinning off the rinse liquid through high-speed rotation of the rotor 5.

After this type of rinse process is carried out, a second processing liquid is fed to the wafers W in the second process space 30. Immediately after supply of a second processing liquid has begun, the rinse liquid remaining in the second process space 30 is mixed with the second processing liquid, and the mixture is discharged from the second process space 30. As the second processing liquid is diluted by the rinse liquid, in the event that the mixture is collected in the processing liquid tank (hereinafter referred to as "second processing liquid tank") of the second processing liquid supply mechanism 35, it is likely that the concentration of the active component of the second processing liquid in the second processing liquid tank will be reduced. Accordingly, in such a case, a new second processing liquid is supplied to the second processing liquid containing in the second processing liquid tank. However, when doing so, it is preferable to control the amount of discharged liquid (i.e., the mixture of the second processing liquid and the rinse liquid) collected into the tank and the amount of the new second processing liquid added into the second processing liquid tank, in order to maintain the process effectiveness by the second processing liquid.

Specifically, based on the amount of the new second processing liquid supplied to the recycle tank of the second liquid process tank, collection of the discharge liquid should be controlled so that the concentration of the active component of the second processing liquid in the recycle tank of the second processing liquid tank becomes higher than prescribed. In this case, is the collection of discharge liquid would cause the processing ability of the processing liquid in the recycle tank to fall below a desired level, control should be set to have collection amount be zero, in other words, the mixture of the second processing liquid and the rinse liquid should not be collected.

During processing with the second processing liquid, from the standpoint of preventing oxidation of the Cu wiring layer 171, a non-oxidizing atmosphere, typically an inert atmosphere, is needed. Accordingly, prior to the supply of the second processing liquid, inert gas $N_s$ gas is supplied to the process space 30 from the $N_s$ gas supply source 55, thereby establishing an inert gas atmosphere in the second process space 30. In the case where $N_s$ gas was supplied to the first process space 20 during the processing with the first processing liquid, the supply of the $N_s$ gas is continued to maintain the inert gas atmosphere.

In this state, as the rotor 5 is rotated by the motor 3, in turn rotating the wafers W, and a second processing liquid, for example, an organic chemical comprised of dimethyl sulfoxide (DMSO) and amine solvent, is released from the spray nozzle 32, and thus applied to the wafers W. Due to the provision of the second processing liquid, the resist film 174, the polymer layers 176 and the oxidized Cu particles 177 are dissolved and lifted off.

Simply applying the second processing liquid without using the first processing liquid would not be successful, as the second processing liquid will hardly penetrate the resist film 174 and the polymer layers 176, and thus be ineffective. However, with this embodiment, since the first processing liquid alters the condition of the surface layers of the resist film 174 and the polymer layers 176 and cracks are formed therein prior to the supply of the second processing liquid, the second processing liquid can easily penetrate into these, this leading to effective utilization.

In addition, non-oxidized Cu particles are difficult to dissolve and remove with the second processing liquid. However, as the Cu particles 177 are oxidized by the first processing liquid, they can be easily removed with the second processing liquid.

During the processing with the second processing liquid, firstly, the second processing liquid is sprayed from the spray nozzle 32 for several tens of seconds. At this time, by rotating the rotor 5 at a low speed in the range of 1 to 500 rpm for the first several tens of seconds, the second processing liquid is spread over the surface of wafers W. In this case, the speed of revolution of the rotor 5 can be used to control how evenly the second processing liquid is spread, based on its viscosity, and the resist film 174, the polymer layers 176 and the oxidized Cu particles 177 can be uniformly dissolved. Uniform diffusion of the second processing liquid becomes possible by, in the case that the viscosity of the second processing liquid is high, having the rotor 5 spin at a higher speed within the aforementioned range, and if viscosity is low, to have the rotor 5 spin at a lower speed within the aforementioned range.

When the resist film 174, the polymer layers 176 and the Cu particles 177 are dissolved, there exists a reacted second processing liquid on the surfaces of the wafers W. As the concentration of the active component in the processing liquid is reduced, the reactivity of the processing liquid is lowered. In such a case, the supply of the second processing liquid should be stopped, and while heated $N_2$ gas is sprayed from the spray nozzle 32 for several seconds, the rotation speed of the rotor 5 should be increased to a high speed in the range of 100 to 3000 rpm, a higher rotation speed than the rotation speed at the time of provision of the second process liquid. As a result of the pressure provided by the inert gas and centrifugal force caused by the revolution of the rotor 5, the reacted second process liquid can be removed from the surfaces of wafers W. At this time, it is preferable to control the rotation speed of the rotor 5 according to the viscosity of the reacted second process liquid adhered on the surfaces of the wafers W.

After the reacted processing liquid is removed from the surfaces of the wafers W in the above fashion, the speed of the rotor 5 is again reduced to a low speed in the range of 1 to 500 rpm, and the second processing liquid is sprayed from spray nozzle 32. By repeating the step of providing the second processing liquid and low-speed rotation of wafers W, and the step of high-speed rotation of the wafers W in order to remove the reacted second processing liquid therefrom, for several times to several thousand times, it is possible to provide a highly reactive new second processing liquid to the surfaces of wafers W at all times, and thus remove the resist film, the polymer layers and the Cu particles efficiently.

After the removal process of the resist layer, the polymer layers, and Cu adhesive particles is completed, IPA or pure water is sprayed from the spray nozzle 32, rinsing from wafers W any remaining reaction products.

The second processing liquid used in the processing is discharged though the second drain port 64 to the drainpipe 65, and collected in the recycle tank of the second processing liquid tank. As needed, in the time between the completion of processing with a second processing liquid and the start of processing with a first processing liquid, a new second processing liquid is supplied to the new liquid tank of the second processing liquid tank. Then, any overflow from the new liquid tank is supplied to the recycle tank of the second processing liquid tank.

While it is acceptable to complete the removal processes after carrying out the aforementioned process with the first processing liquid and the second processing liquid, it is preferable to repeat the processes using the first and second processing liquid several times. In other words, in some cases conducting the processes with the first processing liquid and the second processing liquid only one time each may be insufficient, but repeating the processes leads to more effectiveness, and it is possible to completely remove resist film, polymer layers and Cu particles.

In this case, a rinse process may be carried out after the process with the first processing liquid and before the process with the second processing liquid. Such a rinse process may be carried out by rotating the wafers W, as needed, and by feeding pure water or IPA as a rinse solution to the wafers W while positioning the inner cylinder 8*a* in the retracted position. After pure water or IPA is supplied to the wafers W, a drying process may be conducted by rotating rotor 5 at a high speed, thereby spinning off the rinse liquid from the wafers W.

After this type of rinse process is carried out, a first processing liquid is fed to the wafers W in the first process space 20. Immediately after supply of the first processing liquid has begun, the rinse liquid remaining in the first process space 20 is mixed with the first processing liquid, and the mixture is discharged from the first process space 20. As the first processing liquid is diluted by the rinse liquid, in the event that the mixture is collected in the first processing liquid tank 101, it is likely that the concentration of the active component of the first processing liquid in the first processing liquid tank will be reduced. Accordingly, in such a case, a new first processing liquid is supplied to the first processing liquid in the first processing liquid tank 101. However, when doing so, it is preferable to control the amount of the discharged liquid (i.e., the mixture of the first processing liquid and the rinse liquid) collected into the tank and the amount of the new processing liquid added into the tank, in order to maintain the process effectiveness by the first processing liquid. Specifically, based on the amount of the new processing liquid supplied to the recycle tank 103 of the first liquid process tank 101, collection of the discharge liquid should be controlled so that the concentration of the active component of the first processing liquid in the recycle tank 103 becomes higher than prescribed. In this case, is the collection of discharge liquid would cause the processing ability of the first processing liquid in the recycle tank 103 to fall below a desired level, control should be set to have collection amount be zero, in other words, the mixture of the first processing liquid and the rinse liquid should not be collected.

After the processes with the first and second processing liquids are completed, the inner cylinder 8a is moved from inner side of the outer cylinder 7c to the outer side of the casing 6, thereby positioning the wafers W in the process space 20 formed in the outer cylinder 7c. In this state, the wafers W are rinsed by pure water being sprayed from the spray nozzle 22, and lastly the rotor 5 is rotated at a high speed, and spin-drying of the wafers W is performed.

As mentioned above, through the utilization of differing processing liquids, it is possible to completely remove the resist film, the polymer layers and the Cu particles via wet cleaning, with no dry ashing, and without causing any damage to underlying low-k films.

Figure 9:
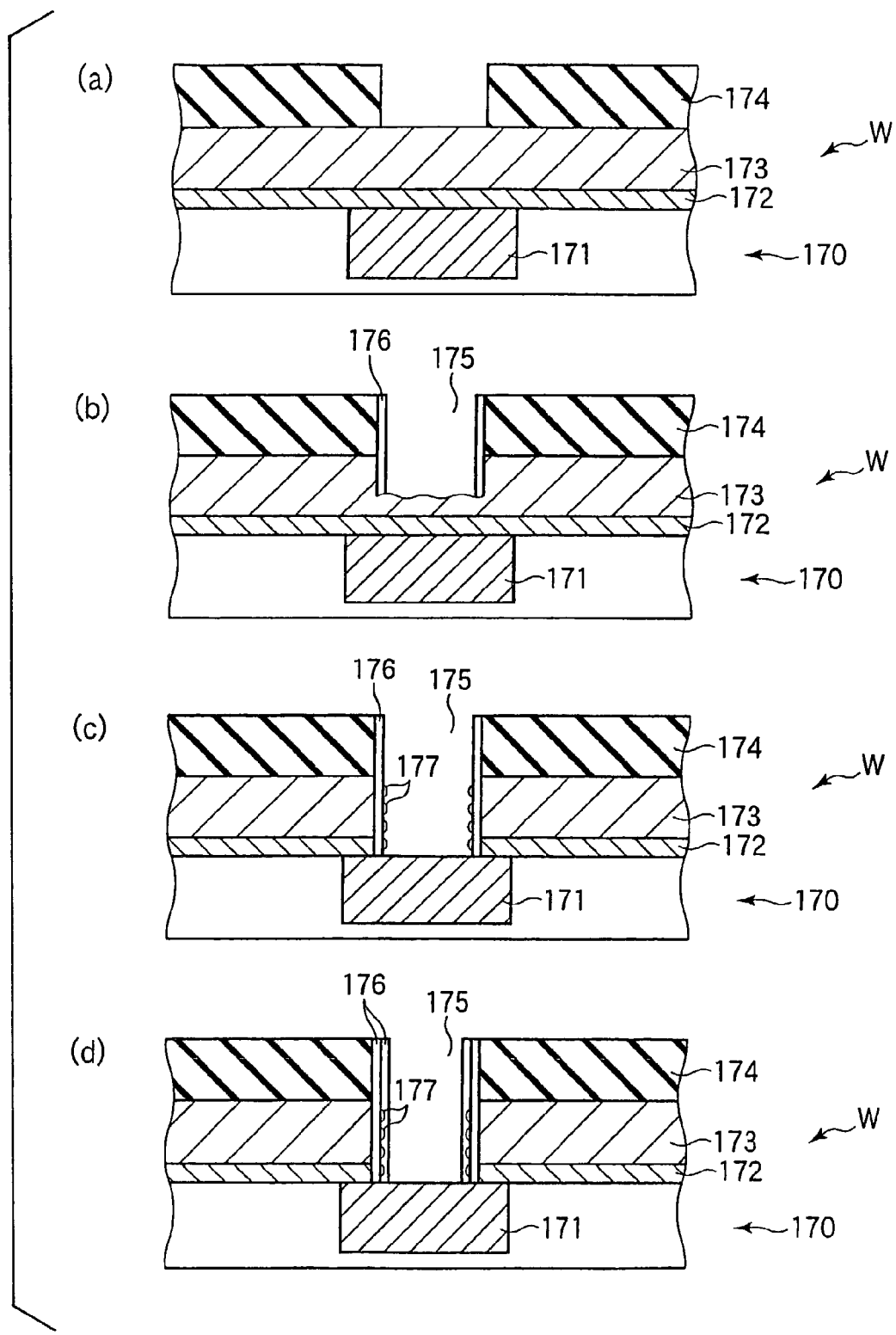
FIGS. 9(a) to 9(d) are cross-sectional views showing an example of the manufacturing process of a semiconductor device, to which the processing method according to the present invention is applied.
Figure 10:
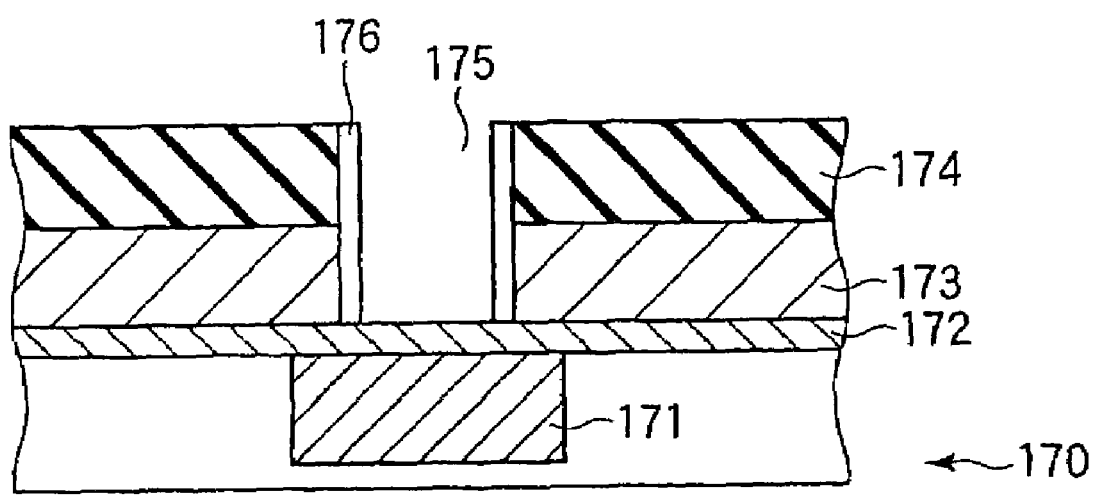
FIG. 10 is a cross-sectional view of another example of the semiconductor device, to which the processing method according to the present invention is applied.

With the example shown in FIG. 9, the via-hole is formed to go through to the Cu wiring layer 171 of the underlying damascene structure. However,in some cases, a via-hole 175 only penetrates to stopper layer 172, as shown in FIG. 10. In this case, as the via-etching does not reach the Cu wiring layer 171, Cu sputter is not generated, and the only objects of removal by processing liquid are the resist film 174 and the polymer layer 176. Of course, in this instance as well, the resist film 174 and the polymer layer 176 can be dissolved and removed in the same manner as in the use of aforementioned processing apparatus 1. Specifically, after the first processing liquid alters the condition of the resist film 174 and the polymer layer 176, making it easy for liquid to permeate, thus enhancing the dissolving and lift-off effect of the second processing liquid, which removes them. During this process, as the Cu wiring layer is not exposed, there is no need for processing with either of the liquids to be done in an inert gas atmosphere, thus it is possible for the process to be carried out in an atmosphere of air.

The present invention is not limited to the embodiment mentioned above, and various other varieties are possible.

For example, the first processing liquid and/or second processing liquid need not be limited to the examples, if displaying the above characteristics or effects.

Also, in the above embodiment, processes with the first processing liquid and the second processing liquid are carried out in two different process spaces 20 and 30, to avoid mixture of the two liquids. However, an apparatus having only a single process space is sufficient.

A processing apparatus having only a single process space, for example, can be constructed by removing the inner cylinder 8a shown in FIGS. 1 and 2. With such an apparatus having only a single process space, since both processes with a first processing liquid and second processing liquid take place in the same process space, it would be necessary to implement a rinse process in the interval between the two processes, and drain the mixture of the processing liquid and the rinse liquid. However, the method of draining and recycling of discharged liquids, the control of the concentration of the active component of the processing liquid, the rinse process, etc., can all be carried out in the same manner as mentioned above with the apparatus as shown in FIGS. 1 and 2.

In the above embodiment, the supply mechanisms for first processing liquid and the second processing liquid are constructed so as to make recycling of both possible. However, a construction making recycling of either liquid is also applicable.

At the time of supplying processing liquid, as long as the flow of processing liquid is formed on the surface of the wafer, the substrate to be processed, it is not absolutely necessary for the wafer to be rotated as indicated in the above embodiment. In addition, this process need not be limited to batch processing, as described above, but may also take the form of single-wafer processing. Further, metallic adhesive particles are not limited to Cu, and foundation of the resist film or the polymer layer is not limited to low-k film.

The object to be processed is not limited to semi-conductor wafers, and the process may be applied to liquid crystal display (LCD) substrates, or other substrates.

According to the present invention, as the first processing liquid alters the surfaces of the resist film and the polymer layer so as to allow the second processing liquid provided thereafter to permeate, this greatly enhances the effectiveness of the second processing liquid's ability to dissolve and lift off the resist film, the polymer layer, thus these can all be completely removed.

Further, even in the case where sputtered metals are adhered to the substrate, only these sputtered metals are oxidized by the first processing liquid. In addition, as the second processing liquid is provided in a non-oxidizing atmosphere, necessary metallic layers, such as Cu wiring layers are not oxidized. Accordingly, only the sputtered metals are dissolved and lifted off. Thus it is possible for the sputtered metals to be completely removed along with the resist film and the polymer layers without causing any damage to the metal layers.

What is claimed is:

1. A substrate processing method comprising the steps of:
preparing a substrate on which objects to be removed are adhered, the objects including a resist film and a polymer layer;
supplying a first chemical liquid onto the substrate in such a manner that the first processing liquid flows on a surface of the substrate; and
supplying a second chemical liquid onto the substrate in such a manner that the second processing liquid flows on the surface of the substrate, wherein
the step of supplying the first chemical liquid alters the resist film and the polymer layer so that they can be dissolved by the second chemical liquid, and
the step of supplying the second chemical liquid dissolves the resist film and the polymer layer having been altered by the first chemical liquid, so that they are lifted off from the substrate.

2. The method according to claim 1, wherein the first chemical liquid has an ability of altering a condition of surfaces of the resist film and the polymer layer from a hydrophobic state to a hydrophilic state.

3. The method according to claim 1, further comprising a step of drying the substrate after the step of supplying the first chemical liquid and before the step of supplying the second chemical liquid.

4. The method according to claim 1, wherein:
the objects include a sputtered metal, and a metallic wiring layer is exposed on the surface of the substrate;
the sputtered metal is oxidized by the first chemical liquid in the step of supplying the first chemical liquid; and
the step of supplying the second chemical liquid is carried out while avoiding oxidation of the metallic wiring layer.

5. The method according to claim 4, wherein, in the step of supplying the second chemical liquid, before starting supplying the second chemical liquid, an inert gas atmosphere is established in a processing space, in which is the substrate is placed, thereby avoiding the oxidation of the metallic wiring layer.

6. The method according to claim 1, wherein each of the step of supplying the first chemical liquid and the step of supplying the second chemical liquid is carried out by spraying each of the chemical liquids while rotating the substrate.

7. The method according to claim 6, wherein:
a plurality of substrates, on each of which a resist film and a polymer layer are adhered, are prepared in the step of preparing the substrate; and
wherein, when the step of supplying the first chemical liquid and the step of supplying the second chemical liquid are carried out, the substrates are held by a rotor with the substrates standing vertically and aligned in a row in a horizontal direction, and are rotated together with the rotor.

8. The method according to claim 6, wherein, when the step of supplying the first chemical liquid or the step of supplying the second chemical liquid is carried out, a rotation speed of the substrate is changed between a first rotation speed and a second rotation speed repeatedly.

9. The method according to claim 1, further comprising a step of repeating the step of supplying the first chemical liquid and the step of supplying the second chemical liquid alternately.

10. The method according to claim 9, further comprising the steps of:
rinsing the substrate after the step of supplying the second chemical liquid and before the step of supplying the first chemical liquid, by supplying a rinse liquid to the substrate;
collecting a first mixture of the first chemical liquid, having been supplied to the substrate, and the rinse liquid, having been supplied to the substrate, to a first processing liquid tank immediately after supply of the first chemical liquid to the substrate has begun; and
mixing the first mixture thus collected with a first chemical liquid contained in the tank, thereby making a second mixture of the first mixture and the first chemical liquid contained in the tank,
wherein the step of supplying the first chemical liquid includes a step of supplying the second mixture to the substrate.

11. The method according to claim 10, further comprising a step of feeding a new first chemical liquid, wherein an amount of the new first chemical liquid to be fed to the tank and/or an amount of the first mixture to be collected to the tank is controlled so that a concentration of an active component of the first chemical liquid contained in the second mixture is adjusted to a value within a designated range.

12. The method according to claim 1, further comprising a step of rinsing the substrate, by supplying a rinse liquid to the substrate, after the step of supplying the first chemical liquid and before the step of supplying the second chemical liquid.

13. The method according to claim 12, further comprising the steps of:
collecting a first mixture of the second chemical liquid, having been supplied to the substrate, and the rinse liquid, having been supplied to the substrate, to a second processing liquid tank immediately after supply of the second chemical liquid to the substrate has begun; and
mixing the first mixture thus collected with a second chemical liquid contained in the tank, thereby making a second mixture of the first mixture and the second chemical liquid contained in the tank,
wherein the step of supplying second chemical liquid includes a step of supplying the second mixture to the substrate.

14. The method according to claim 13, further comprising a step of feeding a new second chemical liquid to the tank, wherein an amount of the new second chemical liquid to be fed to the tank and/or an amount of the first mixture to be collected to the tank is controlled so that a concentration of an active component of the second chemical liquid contained in the second mixture is adjusted to a value within a designated range.

15. A substrate processing method comprising the steps of:
preparing a substrate on which objects to be removed are adhered, the objects including a resist film and a polymer layer;
supplying a first processing liquid onto a substrate in such a manner that the first processing liquid flows on a surface of the substrate, thereby altering the condition of the objects;
supplying a second processing liquid onto a substrate in such a manner that the second processing liquid flows on a surface of the substrate, thereby dissolving the objects thus altered by the first processing liquid and lifting them off from the substrate; and
repeating the step of supplying the first processing liquid and the step of supplying the second processing liquid alternately.

16. The method according to claim 15, further comprising the steps of:
rinsing the substrate after the step of supplying the second processing liquid and before the step of supplying the first processing liquid, by supplying a rinse liquid to the substrate;
collecting a first mixture of the first processing liquid, having been supplied to the substrate, and the rinse liquid, having been supplied to the substrate, to a first processing liquid tank immediately after supply of the first processing liquid to the substrate has begun; and
mixing the first mixture thus collected with a first processing liquid contained in the tank, thereby making a second mixture of the first mixture and the first processing liquid contained in the tank,
wherein the step of supplying the first processing liquid includes a step of supplying the second mixture to the substrate.

17. The method according to claim 16, further comprising a step of feeding a new first processing liquid, wherein an amount of the new first processing liquid to be fed to the tank and/or an amount of the first mixture to be collected to the tank is controlled so that a concentration of an active component of the first processing liquid contained in the second mixture is adjusted to a value within a designated range.

18. A substrate processing method comprising the steps of:
preparing a substrate on which objects to be removed are adhered, the objects including a resist film and a polymer layer;
supplying a first processing liquid onto a substrate in such a manner that the first processing liquid flows on a surface of the substrate, thereby altering the condition of the objects;
supplying a second processing liquid onto a substrate in such a manner that the second processing liquid flows on a surface of the substrate, thereby dissolving the objects thus altered by the first processing liquid and lifting them off from the substrate;

rinsing the substrate, by supplying a rinse liquid to the substrate, after the step of supplying the first processing liquid and before the step of supplying the second processing liquid;

collecting a first mixture of the second processing liquid, having been supplied to the substrate, and the rinse liquid, having been supplied to the substrate, to a second processing liquid tank immediately after supply of the second processing liquid to the substrate has begun; and mixing the first mixture thus collected with a second processing liquid contained in the tank, thereby making a second mixture of the first mixture and the second processing liquid contained in the tank, wherein the step of supplying the second processing liquid includes a step of supplying the second mixture to the substrate.

19. The method according to claim 18, further comprising a step of feeding a new second processing liquid to the tank, wherein an amount of the new second processing liquid to be fed to the tank and/or an amount of the first mixture to be collected to the tank is controlled so that a concentration of an active component of the second processing liquid contained in the second mixture is adjusted to a value within a designated range.

* * * * *